(12) United States Patent
Takeuchi et al.

(10) Patent No.: US 7,246,420 B2
(45) Date of Patent: Jul. 24, 2007

(54) METHOD FOR MANUFACTURING A COMB TEETH TYPE PIEZOELECTRIC ACTUATOR

(75) Inventors: Yukihisa Takeuchi, Nishikamo-Gun (JP); Hiroyuki Tsuji, Nagoya (JP); Kazumasa Kitamura, Ichinomiya (JP); Nobuo Takahashi, Owariasahi (JP)

(73) Assignee: NGK Insulators, Ltd., Nagoya (JP)

( * ) Notice: Subject to any disclaimer, the term of this patent is extended or adjusted under 35 U.S.C. 154(b) by 156 days.

(21) Appl. No.: 11/158,725

(22) Filed: Jun. 22, 2005

(65) Prior Publication Data

US 2005/0273990 A1 Dec. 15, 2005

Related U.S. Application Data

(60) Division of application No. 10/651,769, filed on Aug. 29, 2003, now Pat. No. 6,943,483, which is a continuation of application No. PCT/JP02/01911, filed on Mar. 1, 2002.

(30) Foreign Application Priority Data

Mar. 1, 2001 (JP) .............................. 2001-005711

(51) Int. Cl.
*H04R 17/00* (2006.01)
(52) U.S. Cl. .................. 29/25.35; 29/592.1; 29/830; 29/25.03; 29/25.42; 310/311; 310/328; 333/193
(58) Field of Classification Search ............ 29/25.35, 29/592.1, 622, 825, 830, 831, 846, 848, 851; 310/311, 328, 367, 370; 156/64, 89, 251, 156/277
See application file for complete search history.

(56) References Cited

U.S. PATENT DOCUMENTS

| | | | |
|---|---|---|---|
| 4,072,959 A | 2/1978 | Elmqvist | |
| 5,316,602 A * | 5/1994 | Kogame et al. | 156/64 |
| 5,412,865 A * | 5/1995 | Takaoka et al. | 29/830 |
| 5,745,278 A | 4/1998 | La Flandra | |
| 5,786,833 A | 7/1998 | Naka et al. | |
| 5,793,149 A | 8/1998 | Thiel et al. | |

(Continued)

FOREIGN PATENT DOCUMENTS

EP 0 550 030 A2 7/1993

(Continued)

*Primary Examiner*—Minh Trinh
*Assistant Examiner*—Donghai D. Nguyen
(74) *Attorney, Agent, or Firm*—Burr & Brown (57) ABSTRACT

A piezoelectric actuator is provided, including comb-shape piezoelectric actuators, each including a plurality of piezoelectric layers. The actuators are made by a process including the steps of (1) preparing a plurality of piezoelectric material green sheets on which electrode films are formed and forming slits on a first green sheet using a punch and a die, (2) pulling up the first green sheet using a stripper, (3) pulling up a top portion of the punch slightly from the lowest portion of the pulled up first green sheet, (4) forming second slits in a second green sheet by the punch, (5) pulling up the second green sheet jointly with the first green sheet, (6) pulling up the top portion of the punch slightly from the lowest portion of the pulled up second green sheet, and thereafter laminating green sheets by repeating steps (4) through (6). The layers are thereafter fired.

1 Claim, 8 Drawing Sheets

U.S. PATENT DOCUMENTS

| | | |
|---|---|---|
| 6,273,558 B1 | 8/2001 | Kitahara |
| 6,380,661 B1 | 4/2002 | Henderson et al. |
| 6,502,302 B2 | 1/2003 | Takeuchi et al. |
| 2002/0008742 A1 | 1/2002 | Kitahara |
| 2003/0020370 A1 | 1/2003 | Takeuchi et al. |

FOREIGN PATENT DOCUMENTS

| | | |
|---|---|---|
| FR | 2 710 877 A1 | 4/1995 |
| JP | 06-008429 A1 | 1/1994 |
| JP | 06-071877 A1 | 3/1994 |
| JP | 07-081055 A1 | 3/1995 |
| JP | 2001-053346 A1 | 2/2001 |
| WO | WO 02/089227 A2 | 11/2002 |

* cited by examiner

METHOD FOR MANUFACTURING A COMB TEETH TYPE PIEZOELECTRIC ACTUATOR

CROSS REFERENCE TO RELATED APPLICATIONS

This application is a division of U.S. application Ser. No. 10/651,769, filed Aug. 29, 2003, now U.S. Pat. No. 6,943,483, which is a continuation of International Application No. PCT/JP02/01911, having an international filing date of Mar. 1, 2002, which designated the United States, the entireties of which are incorporated herein by reference.

This application also claims the benefit of Japanese Application 2001-057011, filed Mar. 1, 2001, the entirety of which is incorporated herein by reference.

FIELD OF THE INVENTION

This invention relates to a comb teeth type piezoelectric actuator and a method for manufacturing the same in which a plurality of driving parts, each comprising a plurality of piezoelectric layers, are aligned and allocated. In particular, this invention relates to a comb teeth type piezoelectric actuator and a method for manufacturing the same in which it is hard for interlayer separation to occur and it is also hard to be contaminated. Further, even in a case of comb teeth with a slit width of 70 µm and below and also in a case of comb teeth having slits of a three-dimensional shape, it is easy to manufacture.

BACKGROUND OF THE INVENTION

As an example using a comb teeth type actuator, there are ink jet printers. In case of this ink jet printer, an ink discharging part, as described in Japanese Patent Publication No. 5-246025A, has a plurality of nozzles which are aligned and allocated, ink chambers which contain ink to be discharged at the back part of each nozzle, and pressure generating members which comprise piezoelectric elements at positions opposite to respective nozzles. The ink chambers are pressurized and transformed by transformation of piezoelectric elements, so that ink droplets are discharged to flow. Pressure generating members as actuators are normally aligned and allocated in alignment with positions of the nozzles, and pressure generating members formed of comb teeth shape are utilized as actuators.

Then, in case that resolution of a printer is of 180 dpi, alignment pitch of nozzles becomes 141 µm, and pitch of neighboring actuators, i.e., pitch of comb teeth is also formed by this spacing. Therefore, refined and skilled dimensional precision is required, and an actuator which comprises such comb teeth shaped piezoelectric element is formed in a manner as shown in a manufacturing process chart of FIG. 6. In this manner, a plurality of piezoelectric material green sheets 21 on which electrode films 20 are formed are laminated and sintered to form a multi-layer piezo-actuator 22, and it is processed by a dicer etc. to form slits 23 and comb teeth 24. In addition, in FIG. 6, A shows a before laminating state, and B shows a pressurized and laminated state, and C shows a fired and integrated state, and D shows a state in which comb teeth are formed by carrying out a dicer process.

However, since the forming method in which slit fabrication is carried out by the above dicer etc. occurs after sintering of the piezoelectric material green sheet, corner portions tend to be easily dropped out and interlayer separation tends to easily occur, and in concrete terms, the following problems exists.

Firstly, residual stress occurs between a piezoelectric material layer and an electrode material layer, due to difference etc. of coefficient of thermal expansion of both materials. Therefore, since a surface thereof is exposed by machine work, an interlayer separation defect tends to easily occur during the machine working. Further, separation tends to occur between the piezoelectric material layer/electrode material layer at the worked surface during use.

Secondly, in the slit fabrication, since respective slits are formed by cutting off by the dicer etc., it takes a long amount of time to form the slits, even if they are formed at a dash by a plurality of dicer blades.

Thirdly, cleansing is necessary since it is contaminated by working fluid after the slit fabrication, but because strength after the fabrication is lower, cleansing—drying processes have to be carried out carefully, and at high costs.

Fourthly, there are design constraints. This means that slit width between comb teeth in a practical design is constrained by the thickness of the dicer blade for fabrication use and can not be, approximately, 70 µm and below. Therefore, it was not possible to obtain a comb teeth type actuator of higher density, or higher strength, or higher strength and higher output. Also, since only linear or planar slit fabrication is possible, when comb teeth of a complex shape is necessitated, there was no other choice than accommodating by adhering a component in post-process as described in, for example, Japanese Patent Publication 6-71877A.

SUMMARY OF THE INVENTION

To solve the above problems, the inventors studied a manufacturing method in which, firstly as shown in FIG. 7, the piezoelectric material green sheets 21 are punched out by use of a metal mold, respectively to form slits 23 between comb teeth, and thereafter, they are aligned by use of a jig, laminated and hot pressed, and then fired and integrated. The inventors considered that, with this manufacturing method, residual stress between a piezoelectric material layer and an electrode material layer is relieved, and further, a side surface of comb teeth becomes a high-temperature fired surface so that the cleansing process is simplified.

Figure 8A:
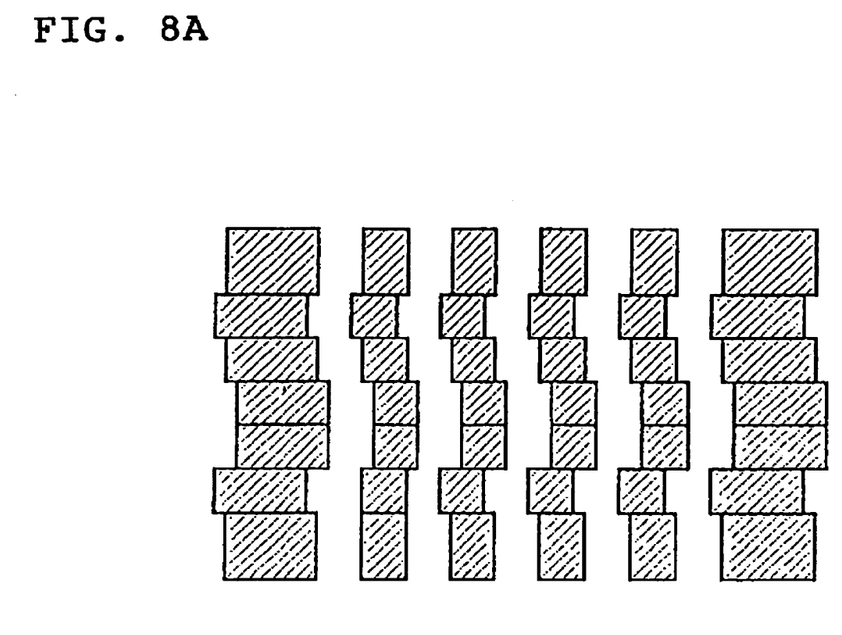
FIG. 8A is a whole view.

However, in an actuator which is formed by this method, as shown in FIG. 8 which shows an end surface looking from Q in FIG. 7, positions between piezoelectric layers of the comb teeth cannot be aligned with good precision, and big misalignment occurs. This misalignment amount M is 10 µm at the lowest, and a magnitude of about 20 µm on the average. This was because in the alignment method, the piezoelectric material green sheets are laminated on a jig having positioning pins in such a manner that the pins pass through positioning apertures of each piezoelectric material green sheet, and to that end, clearance between the pin aperture and the pin is required to be at least about 10 µm. Further, because of suppleness of the piezoelectric material green sheet, it was unavoidable that misalignment between the piezoelectric layers of approximate 20 µm in total occurs when 10 layers and more are laminated.

Figure 8B:
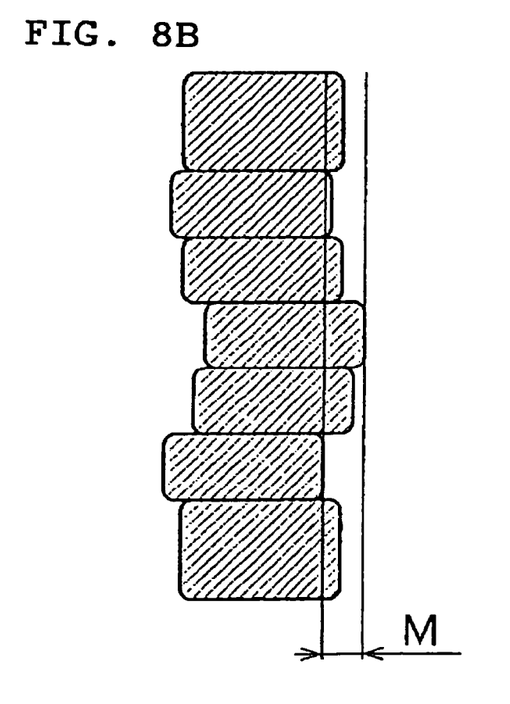
FIG. 8B is a partially enlarged view.
Figure 8C:
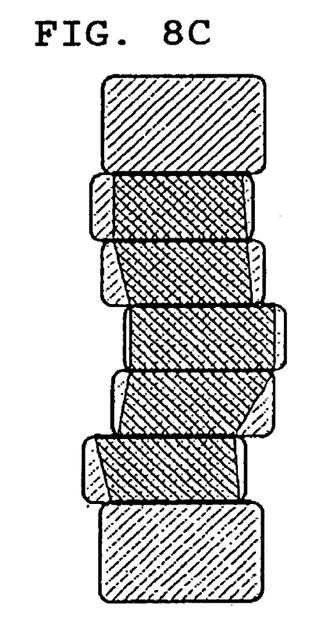
FIG. 8C is an explanatory view for showing a portion which an electric field is applied and piezoelectric strain occurs.

In addition, here, describing reasons that misalignment between the piezoelectric layers becomes an issue, when misalignment occurs between the piezoelectric layers of the comb teeth, an area in which effective electric field occurs inside of the comb teeth becomes uneven, and an area in which piezoelectric strain does not occur is generated widely around the misalignment portion as a center, as shown in an end elevation of FIG. 8C for showing a portion where piezoelectric strain occurs by electric field being applied in a shape of FIG. 8B. As a result, a characteristic of an actuator is dropped down, and further, stress concentration occurs at a boundary portion, and micro-cracks occur during use, which may be a case that it is grown to demolish an element.

Further, such a defect becomes a big problem in a refined comb teeth type actuator, such as a comb teeth pitch of 200 µm and below in particular. Because, if the slit width is set to be 70 µm, the width of the piezoelectric layer is simply 130 µm and below, and if misalignment of no less than 20 µm occurs, an area of more than 10% in totality becomes an area in which piezoelectric strain does not occur.

The present invention is made in light of such experimental results, and a comb teeth type piezoelectric actuator according to the invention includes a plurality of piezoelectric actuators, each comprising a plurality of piezoelectric layers, aligned and allocated in the shape of comb teeth, characterized in that a side surface of each comb tooth comprises a fired surface. In particular, it is preferable that an amount of convex-concave deviation between piezoelectric layers on a side surface of a comb tooth which is opposed to a neighboring comb tooth is less than 5 µm.

Also, it is preferable that the side surface of the comb tooth which is opposite to the neighboring comb tooth may be of a three-dimensional shape from a base part toward a top of the comb teeth. Further, it is preferable that a distance between the neighboring comb teeth is less than 70 µm, or comb teeth pitch is less than 200 µm.

By configuring the comb teeth type piezoelectric actuator in this manner, since an interlayer between the piezoelectric material layer and the electrode material layer exposed to the outside is a high-temperature fired surface, residual stress is relieved and interlayer separation does not substantially occur during processing or during use. Accordingly, it is possible to obtain an actuator structure having excellent durability and reliability. Moreover, a surface is not likely to be contaminated and there occurs no cases of short-circuit defects during use.

A method for manufacturing a comb teeth type piezoelectric actuator according to the invention is a method for manufacturing a comb teeth type piezoelectric actuator in which a plurality of piezoelectric actuators, each comprising a plurality of piezoelectric layers, are aligned and allocated in the shape of comb teeth, characterized by including, a first process in which a plurality of piezoelectric material green sheets on which electrode films are formed are prepared, and slit apertures are formed on a first piezoelectric material green sheet among the above plural piezoelectric material green sheets by use of a punch and a die, a second process in which the above first piezoelectric material green sheet is pulled up by use of a stripper, a third process in which a top portion of the above punch is pulled up to the extent that it is pulled in slightly from the lowest portion of the above pulled up first piezoelectric material green sheet, a fourth process in which second slit apertures are formed in a second piezoelectric material green sheet using the above punch, a fifth process in which the above second piezoelectric material green sheet is pulled up jointly with the above first piezoelectric material green sheet, and a sixth process in which the top portion of the above punch is pulled up to the extent that it is pulled in slightly from the lowest portion of the above pulled up second piezoelectric material green sheet, and thereafter, a plurality of the piezoelectric material green sheets being laminated by repeating from the fourth process to the sixth process to form a plurality of piezoelectric layers of comb teeth shape and to thereafter be fired.

By manufacturing the comb teeth type piezoelectric actuator in this manner, the punch itself is used as a laminating axis of the piezoelectric material green sheets, and without moving the punched-out piezoelectric material green sheet, the comb teeth are formed by superposing them sequentially, and therefore, there occurs no transformation of slit apertures and laminating is carried out with high precision so that a side surface of the comb teeth with little convex-concave deviations between piezoelectric layers can be formed. Therefore, it is possible to make an actuator with excellent characteristic, even in a case of the comb teeth with a slit width of less than 70 µm, or a comb teeth pitch of less than 200 µm.

Also, by design of a punch-out metal mold, a slit may be of a three-dimensional shape, and the slit width equals to punch process width of the metal mold at the time of the punching-out of the piezoelectric material green sheets but is shrunk during the firing process, and therefore, it is possible to finally form refined slots with a width of 30–50 µm.

Further, since the slit portion is formed before firing and the interlayer between piezoelectric material layer—electrode material layer which is exposed to the outside in a finished product is a high-temperature fired surface, residual stress is relieved and interlayer separation does not substantially occur during processing or during use. Therefore, it is possible to obtain products with excellent durability and reliability. Also, a surface is hard to be contaminated and abnormalities due to contamination such as short-circuit defects etc. are not likely to occur during use.

BRIEF DESCRIPTION OF THE DRAWINGS

FIGS. 2A–2E are process explanatory views which show a method for carrying out slit fabrication and laminating of piezoelectric material green sheets in FIGS. 1A–1E at the same moment.

FIGS. 5A–5C show an end elevation looking from P in FIG. 1C.

FIGS. 6A–6D are explanatory views which show a method for manufacturing a conventional comb teeth type piezoelectric actuator.

FIGS. 7A–7D are explanatory views which show another method for manufacturing a conventional comb teeth type piezoelectric actuator.

FIGS. 8A–8C show an end elevation looking from Q in FIG. 7C.

DETAILED DESCRIPTION OF THE INVENTION

Figure 1A:
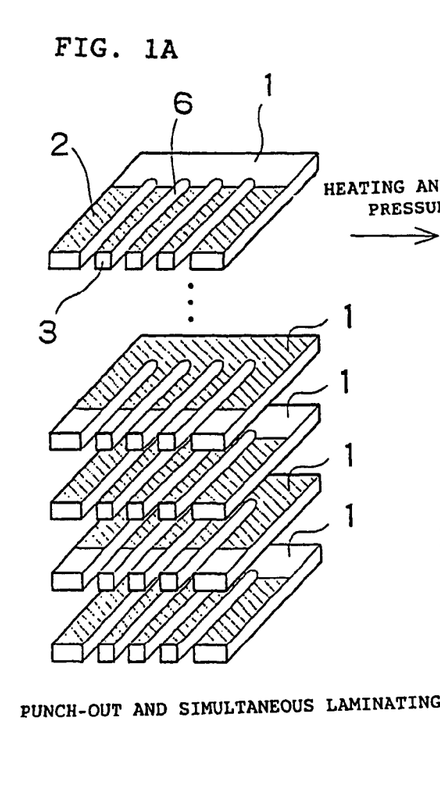
FIGS. 1A–1E are explanatory views which show a comb teeth type piezoelectric actuator and a method for manufacturing the same according to the invention.

The invention will be described in detail with reference to the drawings. FIGS. 1A–D show one example of a comb teeth type piezoelectric actuator according to the invention, and an outline of a manufacturing process therefore. FIG. 1E shows a finished comb teeth type piezoelectric actuator. A manufacturing procedure is that, after forming an electrode film 2 on a piezoelectric material green sheet 1 (hereinafter, simply referred to as a sheet), slits 6 of each sheet 1 are formed as illustrated in FIG. 1A, i.e., the steps of forming comb teeth 3 and laminating the green sheets are carried out at the same moment by a method described later in which the comb teeth 3 are formed by laminating sheets, and by the time of completion of punching-out, the laminating of the layers is completed.

Figure 1B:
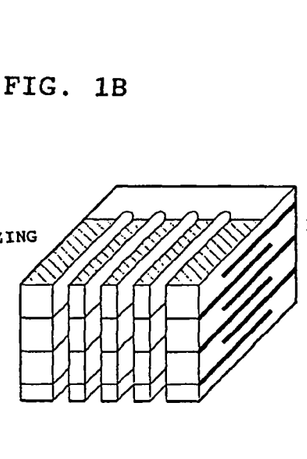
Figure 1C:
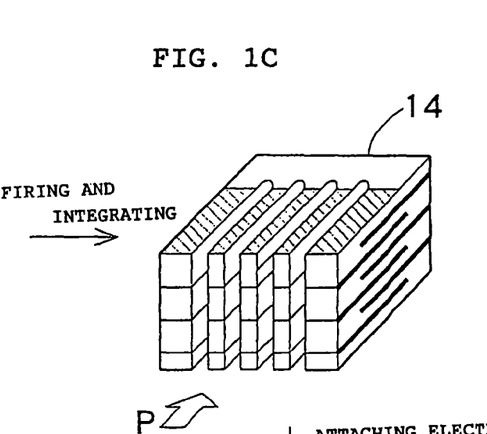
Figure 1D:
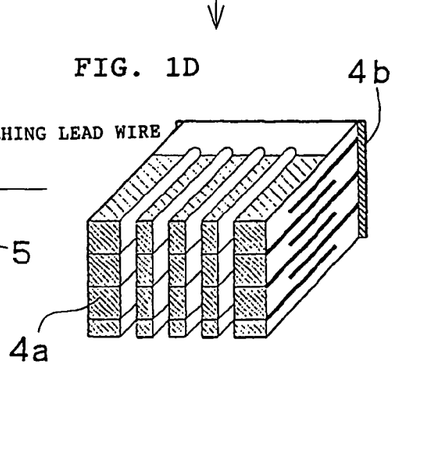
Figure 1E:
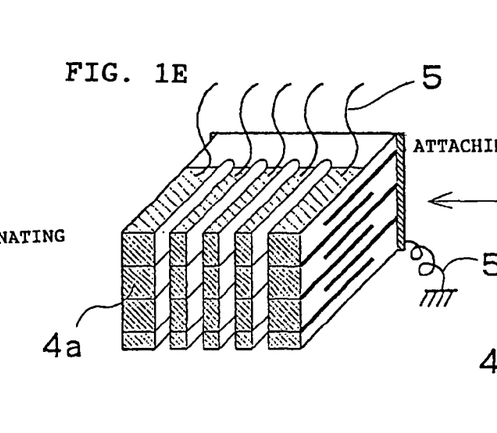

Then, respective layers are placed in contact, heated and pressurized as shown in FIG. 1B, and fired as shown in FIG. 1C to obtain and a driving part 14 of a multi-layer piezo-actuator. Thereafter, electrodes 4a and 4b are formed on an end surface as shown in FIG. 1D, and a lead wire 5 is attached to each comb tooth as shown in FIG. 1E to form the final product of a comb teeth type piezoelectric actuator.

Thus, since the comb teeth 3 are formed before firing, it is not necessary to fabricate slits by a dicer etc. to form the comb teeth, and since a side surface of the comb teeth are maintained to be a fired surface without change, an end surface between the piezoelectric material layer—the electrode material layer is not exposed after the firing. Accordingly, residual stress between piezoelectric layers is relieved, and during processing, chipping of an end portion and interlayer separation are not likely to occur, and even during use, interlayer separation is not likely to occur, and durability and reliability can be improved. Also, since the fired surface is used, the surface is hard to be contaminated and a short-circuit defect is hard to occur during use. Further, since the slit fabrication is not carried out after sintering, cleansing—drying processes can be simplified.

FIG. 2 shows a concrete manufacturing method for carrying out the simultaneous lamination of the green sheets and formation of the comb teeth 3. The method employs a metal mold including a punch 7 around which a stripper 9 for operating sheet laminating is disposed and a die 8. FIG. 2A shows a before punching-out state in which a first sheet 1a is mounted on the die 8, and in FIG. 2B, the punch 7 and the stripper 9 are lowered and the sheet 1a is punched out to form slit apertures and comb teeth (First Process).

Figure 2A:
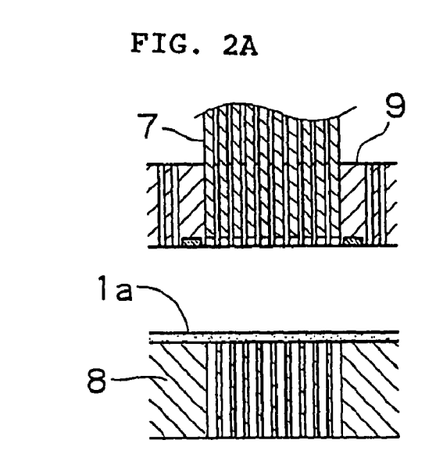
FIG. 2A is a view in which a first piezoelectric material green sheet is mounted on a die.
Figure 2B:
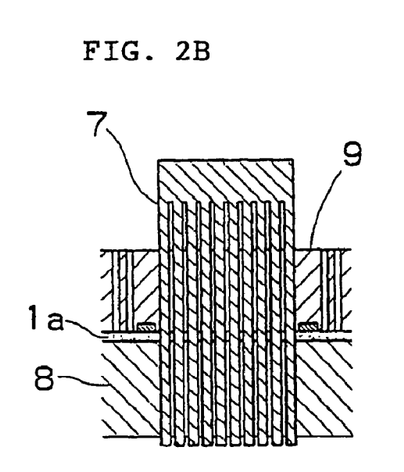
FIG. 2B is a process chart for punching out the first piezoelectric material green sheet.
Figure 2C:
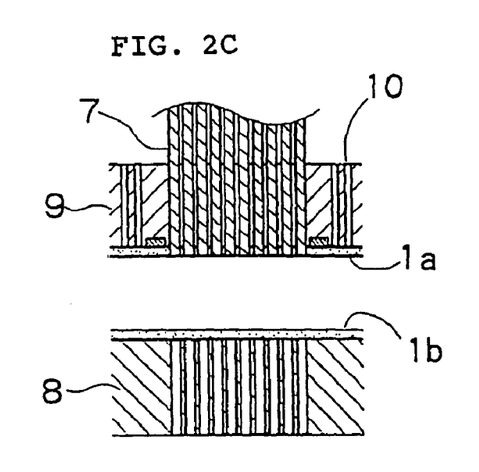
FIG. 2C is a view in which a second piezoelectric material green sheet is mounted.

Then, punching-out of a second sheet 1b is prepared, and at this time, as shown in FIG. 2C, the first sheet 1a is moved upward while remaining in contact with stripper 9 and separated from the die 8 (Second Process). A method for contacting and holding the sheet 1 against a portion of the stripper 9 can be carried out by forming a suction aperture 10 in the stripper 9 to carry out vacuum suction.

Also, to prepare punching-out of the second sheet 1b, the punch 7 and the stripper 9 are pulled up from the die 8, and at mid-flow of the pull-up, it is preferable that a top portion of the punch 7 is not retracted to the inside of the aperture of the first sheet 1a, which is in contact with and pulled up jointly with the stripper. When the pull-up of the stripper is stopped, it is important that the top portion of the punch is stopped at a position where it is pulled in slightly from the lowest portion of the sheet 1a which was pulled up jointly with the stripper (Third Process). If the punch 7 is retracted to the inside of the aperture of the first sheet 1a, or is housed completely in the stripper 9, the apertures formed in the sheet are transformed since the sheet 1 is soft. Thus, the flatness of a side surface is deteriorated when the sheets are laminated to form the comb teeth.

Figure 2D:
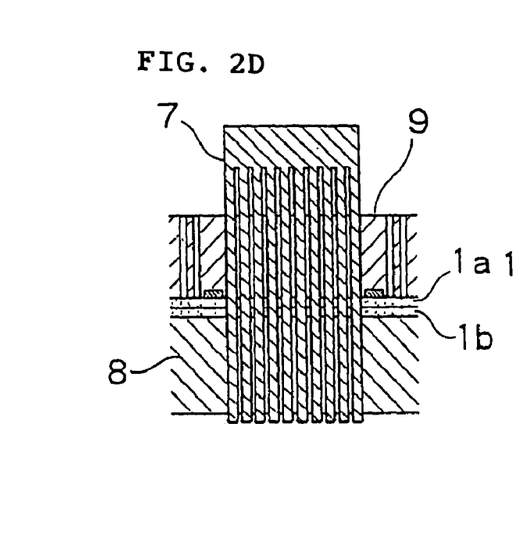
FIG. 2D is a process chart for punching out the second piezoelectric material green sheet.

FIG. 2D shows a process for punching out the second sheet 1b, and by contacting the first sheet 1a to the stripper 9, the second sheet 1b is easily mounted on the die 8 and punched out as in the process illustrated in FIG. 2B. At the same time, the second sheet is overlapped on the first sheet 1a (Fourth Process).

Then, the first sheet 1a and the second sheet 1b, which were punched out by repeating the processes shown in FIGS. 2C and 2D, are overlapped and pulled up by the stripper 9 (Fifth Process), and punching-out of a third sheet 1c is prepared. However, also at this time, it is important that a top portion of the punch is stopped at a position where it is pulled in slightly from the lowest portion of the sheet which was pulled up jointly with the stripper, i.e., where the punch is pulled in slightly from the lowest portion inside the second sheet 1b (Sixth Process).

Thereafter, by repeating the processes from the Fourth Process to the Sixth Process, punching-out and laminating of the sheets as required are repeated.

Figure 2E:
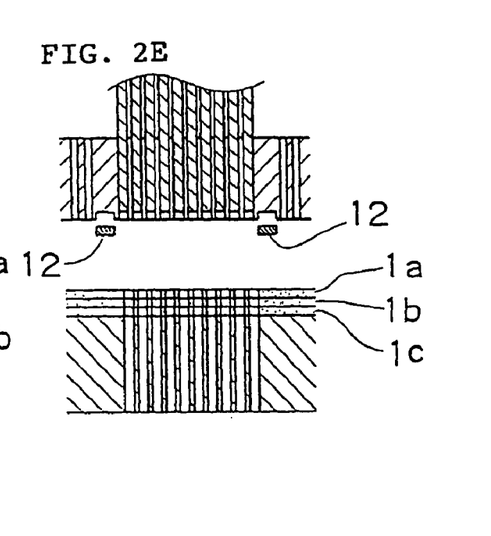
FIG. 2E is a process chart in which punching out and laminating of all sheets are completed and laminated sheets are separated from a stripper.
Figure 3A:
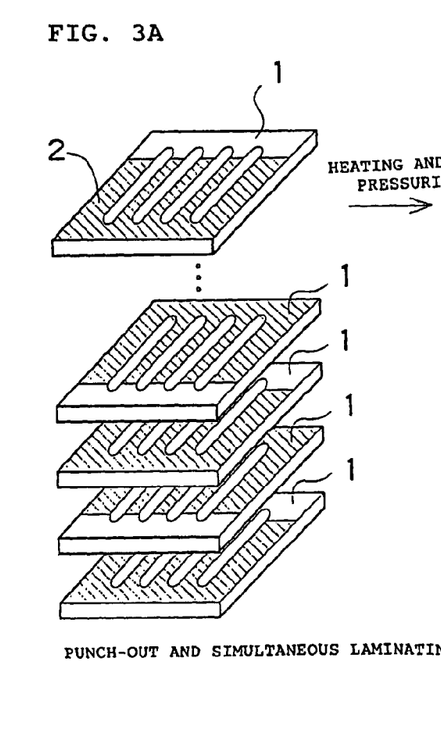
FIGS. 3A–3D are explanatory views which show another manufacturing method of the invention.
Figure 3B:
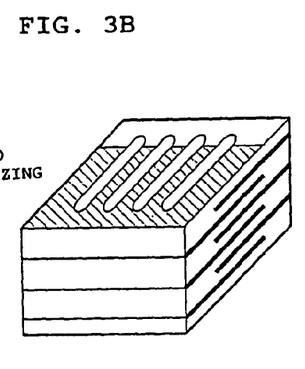
Figure 3C:
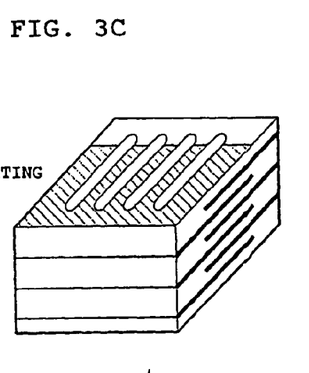
Figure 3D:
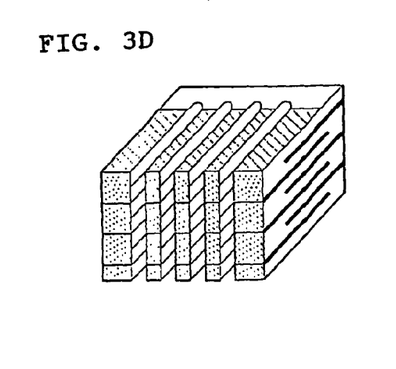

FIG. 2E shows a state where the punching-out process is completed. When punching-out and laminating of sheets 1 as required are completed, holding of the sheets by the stripper 9 is released, and it becomes possible that the sheets 1 which were punched out and laminated are separated from the stripper 9. The separation of the laminated sheets from the stripper 9, as shown in FIG. 2E, can be insured by disposing a separation jig 12 on an under surface of the stripper.

The operation described above is one which a manufacturing method described in Japanese Patent Publication No. 2000-280573A is applied to, and thereafter, according to need, a pressurizing and laminating process is carried out to form a laminated body which is capable of being handled, and then, on the condition which is suitable to characteristics of the piezoelectric material green sheets and the electrode materials, the laminated body is fired and integrated.

Figure 5A:
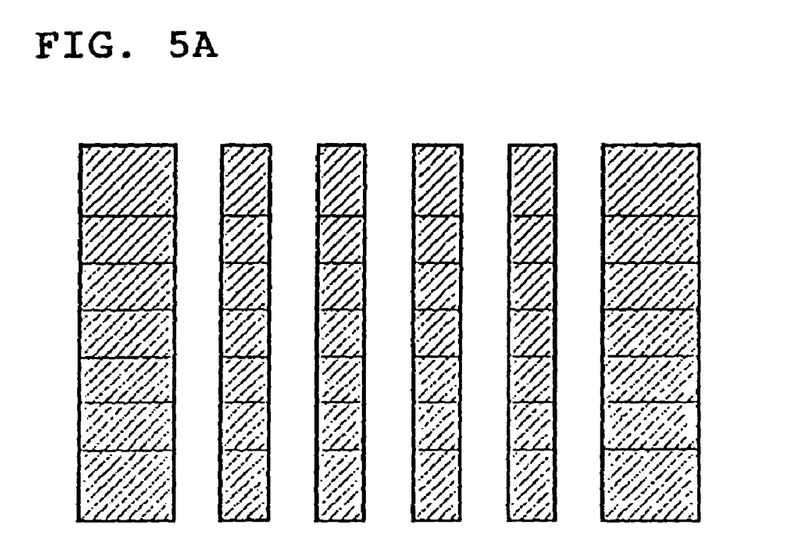
FIG. 5A is a whole view.
Figure 5B:
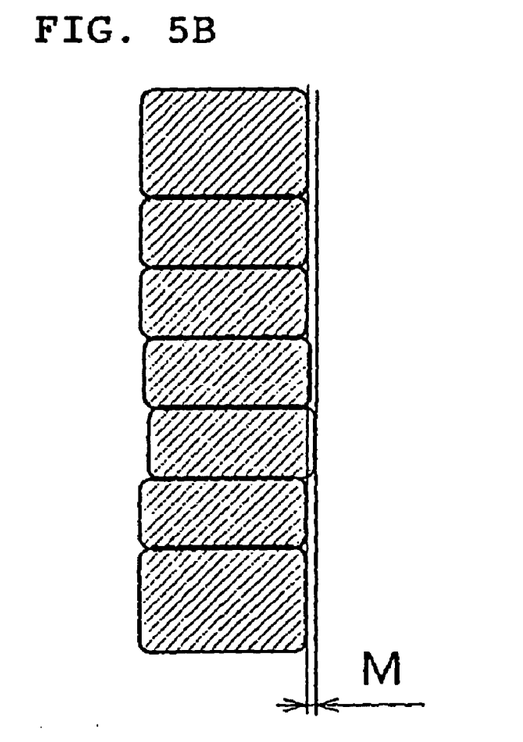
FIG. 5B is a partially enlarged view.
Figure 5C:
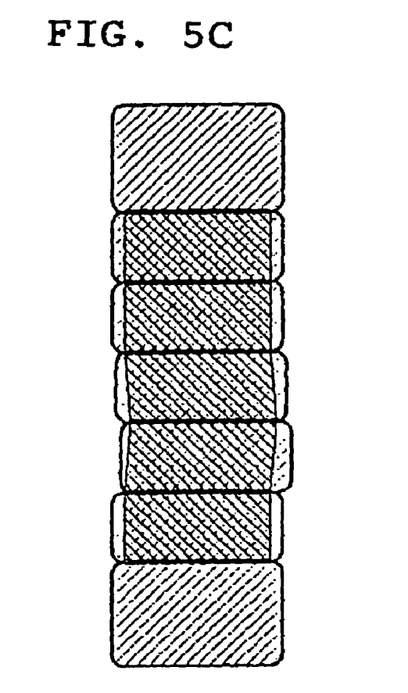
FIG. 5C is an explanatory view for showing a portion which an electric field is applied and piezoelectric strain occurs.
Figure 6A:
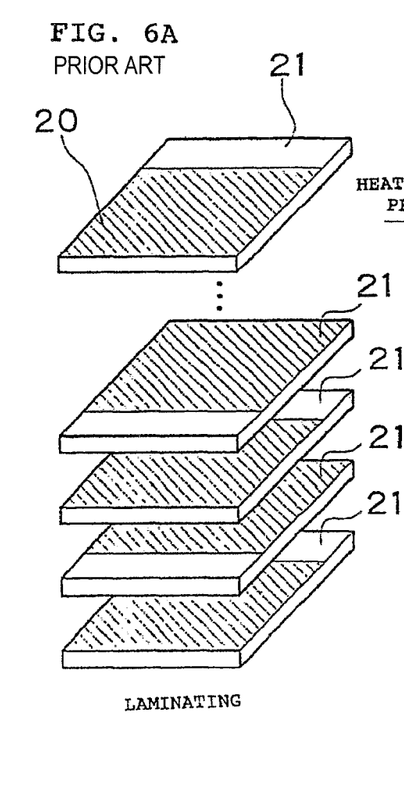
FIG. 6A shows a before laminating state.
Figure 6B:
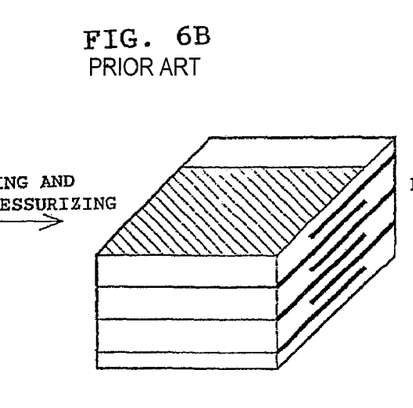
FIG. 6B shows a pressurized and laminated state.
Figure 6C:
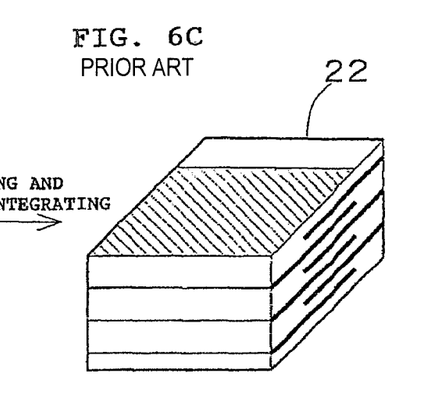
FIG. 6C shows a fired and integrated state.
Figure 6D:
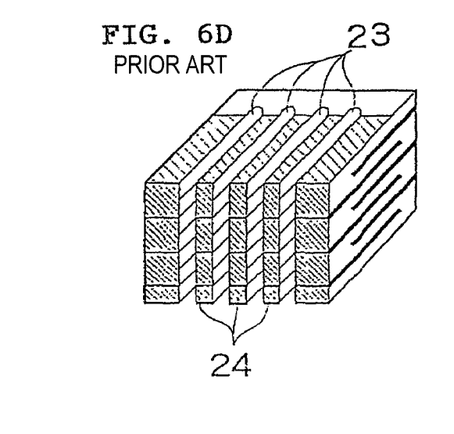
FIG. 6D shows a state in which comb teeth are formed by dicer process.
Figure 7A:
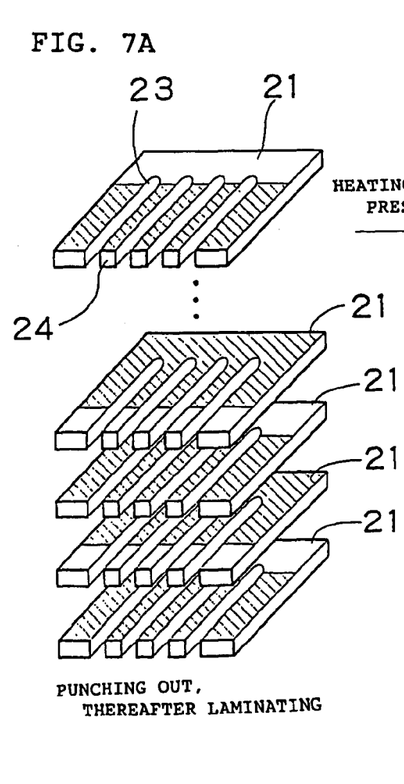
FIG. 7A shows an aspect in which laminating is carried out after punching-out.
Figure 7B:
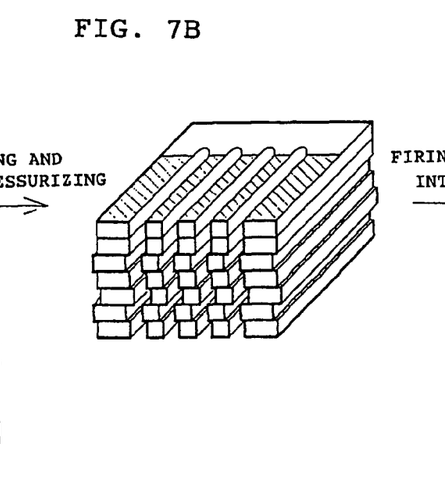
FIG. 7B shows an aspect after laminating and firing.
Figure 7C:
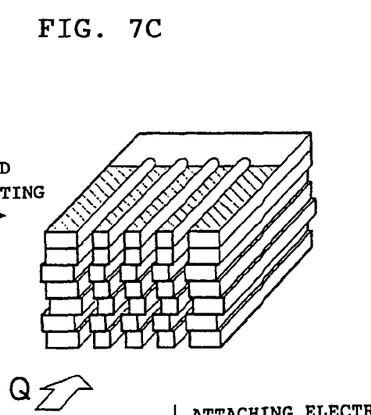
Figure 7D:
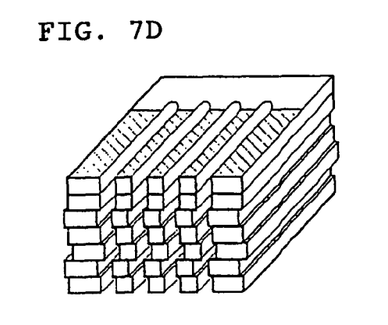

FIG. 5 shows an explanatory view of an end surface of the comb teeth looking from P shown in FIG. 1C. While FIG. 5A is a whole view, FIG. 5B is an enlarged view. FIG. 5C shows a portion where piezoelectric strain occurs when an electric field is applied to the comb teeth. As is shown in FIGS. 5A–5C, since respective piezoelectric layers of each comb tooth can be superposed with little or no occurrence of the distortion, the piezoelectric strain after the above firing can be generated in the form of uniformity.

Showing experimental values of superposition precision according to the above manufacturing method, for example, on a sheet with a thickness of 40 μm and a Young's modulus of 39 N/mm$^2$, formed are comb teeth with slits between the comb teeth of 70 μm and a width of the comb teeth of 100 μm. In a case where ten sheets are superposed, an amount of distortion between respective layers after firing is 4 μm at the maximum, and side surfaces of the comb teeth are smooth without convex-concave deviations therein. Also, the slit width after firing is about 55 μm, resulting from firing shrinkage.

As just described, the above manufacturing method, even if the slit width is less than 70 μm or even if the comb teeth pitch is less than 200 μm, can easily form the comb teeth, and it is possible to suppress the distortion amount in each layer to be less than 5 μm.

Thus, since the formation of the slits in the green sheets and lamination of the green sheets are carried out simultaneously by use of the punch and the die, and using the punch itself as a positioning axis of laminating of the piezoelectric material green sheets prevents transformation of slit apertures which were punched out by the punch, transformation of the slit apertures does not occur and the laminating is carried out with a high precision. Further, side surfaces of the comb teeth can be formed with little convex-concave deviations therein. Therefore, even if the slit width of the comb teeth is less than 70 μm, or the comb teeth pitch is less than 200 μm, an actuator with excellent characteristics can be formed.

Also, in the above method, since it is not necessary to have a jig which moves the sheet and a space for superposition, the manufacturing line can be simplified and manufacturing with low cost is possible.

Moreover, although the slit width in the green sheets is almost the same as the punch width of the metal mold at the time of the sheet punching-out, the slits shrink at the time of firing, and thus, it is possible to form refined slits with a width of 30–50 μm by combination of thin-walled processed slits and firing shrinkage according to the above manufacturing method.

Figure 4A:
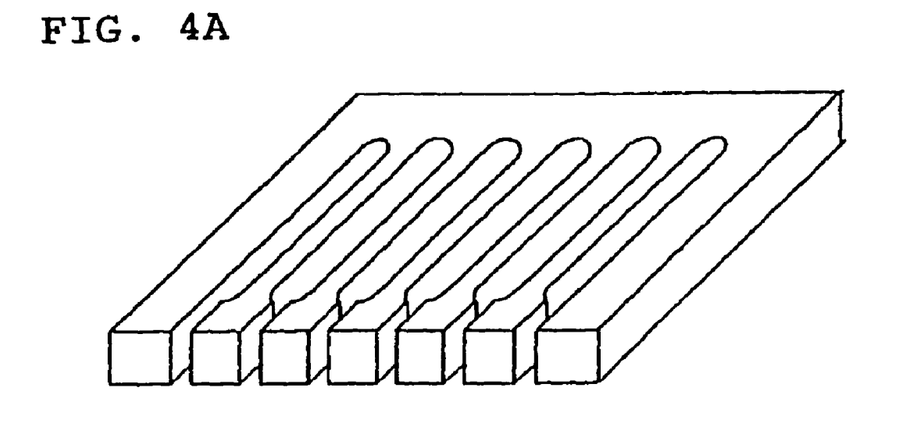
FIGS. 4A–4C are oblique perspective views which show another shape of a comb teeth type piezoelectric actuator of the invention.
Figure 4B:
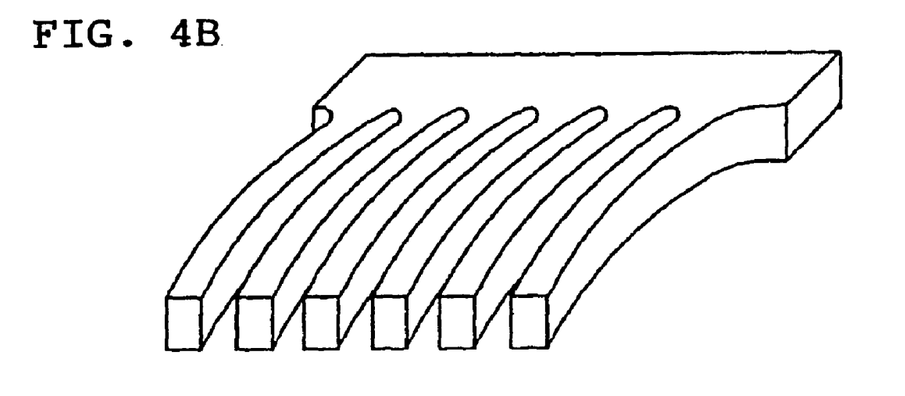
Figure 4C:
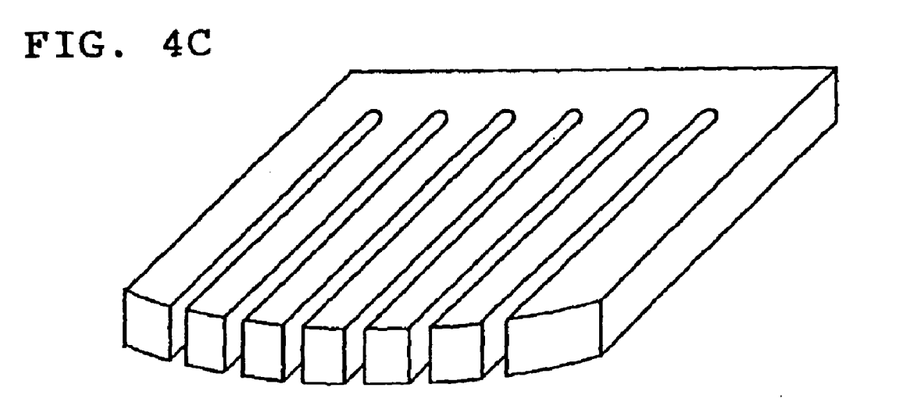

Further, by design of a punching-out metal mold, it is possible to carry out a process of punching out to produce a curved surface, and it becomes possible to form comb teeth of various shapes. As shown in FIG. 4, side surfaces of the comb teeth or a top surface shape are not a simple flat surface, and an optimal shape can be formed as desired. FIG. 4A is of a shape that a top portion of the comb teeth is formed with broad width and a contact area of each comb tooth to an object to be pressed is broadened. FIG. 4B shows that each comb tooth has a spring characteristic. By forming the comb teeth in such a manner, it is possible to use the comb teeth favorably as a micro relay. In FIG. 4C, the top surface is made to be a curved surface by changing a length of each comb tooth. By forming the comb teeth such a manner, it is also possible to have the object to be pressed allocated on a curved surface.

In addition, in order to assure the contact between respective sheets on the occasion of the sheet laminating, an adhesive may be applied to a surface of the sheet. Also, an adhesive sheet may be sandwiched between sheets.

FIG. 3 shows another manufacturing method according to the present invention. As shown in FIG. 3A, after an electrode film is formed on the sheet 1, aperture formation in each sheet 1 and laminating are carried out simultaneously by using the processing method mentioned above. As shown in FIGS. 3B and 3C, after completion of aperture formation in the sheets and lamination of the sheets, respective layers are brought into contact with each other. Heated, pressurized and fired. Then, as shown in FIG. 3D, a process for cutting off an end portion of the fired laminate is carried out to form the comb teeth. Thereafter, as shown in FIGS. 1D and 1E, electrodes are formed on an end surface and lead wires are attached to each comb tooth to complete the final product.

As mentioned above, comb teeth are not formed directly at the time of punching-out, and laminating is carried out by coupling both end portions of the comb teeth, thereby, it becomes possible to further improve the superposition precision of the comb teeth portion of each sheet. However, since it is necessary to carry out a process for cutting off the end portion after firing and it is necessary to adequately cleanse the cut-off processed portion, processing time will be increased.

Although a comb teeth type piezoelectric actuator has been disclosed for use in a piezoelectric type ink jet head in the above embodiment, the comb teeth type piezoelectric actuator according to the present invention may be applied to other uses, for example, as a micro relay and a micro switch, which is greatly contributing to the progress of industry.

What is claimed:

1. A method for manufacturing a comb-shaped piezoelectric actuator in which a plurality of piezoelectric actuators, each comprising a plurality of piezoelectric layers, are aligned and allocated in the shape of comb teeth, said method comprising the steps of:

in a first processing step, forming electrode films on a plurality of piezoelectric material green sheets and forming slit apertures on a first piezoelectric material green sheet among the plurality of piezoelectric material green sheets using a punch and a die;

in a second processing step, pulling the first piezoelectric material green sheet using a stripper;

in a third processing step, pulling up a top portion of the punch to the extent that the top portion of the punch is pulled in slightly from the lowest portion of the pulled up first piezoelectric material green sheet;

in a fourth processing step, forming second slit apertures in a second piezoelectric material green sheet using the punch;

in a fifth processing step, pulling up the second piezoelectric material green sheet together with the first piezoelectric material green sheet; and in a sixth processing step, pulling up the top portion of the punch to the extent that the top portion of the punch is pulled in slightly from the lowest portion of the pulled up second piezoelectric material green sheet, laminating the plurality of the piezoelectric material green sheets by repeating the fourth to the sixth processing steps to form a plurality of piezoelectric layers having a comb teeth shape, and then firing the plurality of piezoelectric layers having the comb teeth shape to form the comb-shaped piezoelectric actuator.

* * * * *